US006728330B1

(12) United States Patent
Aue

(10) Patent No.: US 6,728,330 B1
(45) Date of Patent: Apr. 27, 2004

(54) REGISTER ARRANGEMENT FOR A MICROCOMPUTER WITH A REGISTER AND FURTHER STORAGE MEDIA

(75) Inventor: Axel Aue, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/168,165
(22) PCT Filed: Oct. 26, 2000
(86) PCT No.: PCT/DE00/03781
§ 371 (c)(1),
(2), (4) Date: Oct. 2, 2002
(87) PCT Pub. No.: WO01/44928
PCT Pub. Date: Jun. 21, 2001

(30) Foreign Application Priority Data

Dec. 15, 1999 (DE) .......................................... 199 60 716

(51) Int. Cl.⁷ .............................................. G11C 19/28
(52) U.S. Cl. .............................. 377/57; 377/54; 377/60; 377/63; 377/77; 712/228; 712/244
(58) Field of Search .............................. 377/26, 57, 77, 377/60, 63, 54; 712/228, 244; 711/109, 219; 710/260–9

(56) References Cited

U.S. PATENT DOCUMENTS 3,937,984 A    2/1976   Fry ........................ 307/221 C
5,319,792 A  * 6/1994   Ehrg et al. .................. 395/800

FOREIGN PATENT DOCUMENTS

DE          196 11 520          9/1997

OTHER PUBLICATIONS

Trembly et al., "*VLSI Implementation of a Shift-Register File*," Hawaii Int'l Conference on System Sciences, Jan. 6, 1987.
Ercanli et al., "*A Register File and Scheduling Model for Application Specific Processor Synthesis*," IEEE Bd. Conf. 33, Jun. 3, 1996.
$I_{DDQ}$ Testing, http://www.cedcc.psu.edu/ee497f/rassp_43/sld072.htm—sld080.htm, Dec. 14, 1999.

* cited by examiner

Primary Examiner—Margaret R. Wambach
(74) Attorney, Agent, or Firm—Kenyon & Kenyon

(57) ABSTRACT

There is provided a register system of a microcomputer having a register that includes at least one register bit and having an additional storage arrangement allocated to the register and on which the data content of the register is able to be intermediately stored. To reduce the computing time for saving the data content of the register, while keeping the silicon surface required for the register system as small as possible, the additional storage arrangement includes at least one shift register having at least two shift register cells, the content of an arbitrary shift register cell being transferable into a register bit, and, conversely, the content of a register bit being transferable into an arbitrary shift register cell.

9 Claims, 1 Drawing Sheet

REGISTER ARRANGEMENT FOR A MICROCOMPUTER WITH A REGISTER AND FURTHER STORAGE MEDIA

FIELD OF THE INVENTION

The present invention relates to a register system of a microcomputer having a register including at least one register bit, and having an additional storage arrangement that is allocated to the register, and on which the data content of the register can be intermediately stored.

BACKGROUND INFORMATION

A microcomputer may include a plurality of different registers to increase the processing speed. Thus, for example, the microprocessor of a microcomputer may include a data register and an address register in its execution unit. For floating-point calculation, the processor may include a plurality of registers (arithmetic registers) in the floating point unit (FPU), and for calculation with whole numbers it may include a plurality of such registers in the integer unit (IU). In addition, a microprocessor may also include command registers.

Data is filed in the registers by applications that run on the microcomputer. If an application using a register is interrupted by a higher-priority application wishing to use the same register, the register must be freed for the higher-priority application as quickly as possible and without data loss. For this purpose, the data, filed in the register, of the lower-priority application may be stored intermediately in an additional storage arrangement. The additional storage arrangement may include, for example, a stack on which the data of the register are saved. The higher-priority application may then file its data in the register. After the termination of the higher-priority application, the data saved on the stack may be loaded back into the register, and the interrupted, lower-priority application may then be continued.

A plurality of applications having different priorities may be executed in nested fashion, so that the data of a plurality of interrupted applications are filed on the stack temporarily. For example, in microcomputers used for real-time processing, lower-priority applications may be interrupted by higher-priority applications, and the data of the lower-priority applications should be saved from the register on a stack. Interrupts are used for the interruption of the lower-priority application.

However, the saving of the content of a register on a stack may require a relatively large number of clock pulses of the CPU. After the interruption of a lower-priority application during the saving of the data content of the register on a stack, a delay may result before the register is free, and before the higher-priority application may be processed and may execute its actual tasks.

To reduce or avoid this delay of a higher-priority application, the additional storage arrangement may include register banks, i.e., to multiply realize the registers of the microcomputer. When necessary, the data from the register may be saved in a short time on the register banks, with a relatively small number of clock pulses. However, the register banks are complete registers. Since the flip-flops require a relatively large surface, the-register banks correspondingly require a large amount of silicon surface. However, for reasons of space and cost, a microprocessor should be implemented on a silicon surface that is as small as possible, or as many registers as possible should be situated on the same surface.

SUMMARY OF THE INVENTION

An object of an exemplary embodiment according to the present invention is to construct and develop a register system so that the computing time for saving data content of the register is reduced, while the silicon surface required for the register system is kept as small as possible.

To achieve this object, based on the register system of the type named above, an exemplary embodiment according to the present invention provides the additional storage arrangement as at least one shift register having at least two shift register cells, the content of an arbitrary shift register cell being transferable into a register bit, and, conversely, the content of a register bit being transferable into an arbitrary shift register cell.

In German Published Patent Application No. 196 11 520, an IDDQ test for a computer is referred to, in which a control unit contains an arrangement that causes the computer to assume particular operating states. In addition, an acquisition arrangement is provided that acquires the current or the voltage of the power supply circuit of the computer, whereupon, in a comparator arrangement, the acquired current or the acquired voltage is compared with at least one predetermined threshold value. For the actuation of the display device and/or of the switching off, an actuating arrangement is provided that, depending on the result of the comparison, displays an error if necessary, or, in reaction to such an error, causes the entire system or subareas of the system to switch off.

In an exemplary register system according to the present invention, the register is therefore not multiply realized, but rather is merely provided with at least one additional shift register for the saving of the data content of the register. Moreover, since shift registers require a smaller silicon surface than do register banks that are equivalent in terms of storage space, an exemplary register system according to the present invention may require a small silicon surface.

For the saving of the data content of the register in the shift register, a smaller number of clock pulses may be required, in which the content of the register is saved on a stack.

An exemplary register system according to the present invention therefore requires a low number of clock pulses of the CPU for the saving of the data content of the register, while requiring only a small silicon surface.

If static structures (CMOS architecture) are used exclusively in an exemplary register system according to the present invention, then the functional capacity of the microcomputer may be tested with the aid of an IDDQ test. The IDDQ test is based on the fact that error-free CMOS circuits have an extremely small power consumption when they are in an idle state. An error in the CMOS circuit may result in a significant increase in the power consumption. It is understood that the IDDQ test is described in detail on the website of the Center for Electronic Design, Communications & Computing.

According to an exemplary embodiment of the present invention, a shift register is allocated to each register bit of the register. In this manner, the content of an arbitrary register bit may be shifted into the shift register allocated to the register bit as needed. In this way, the saving of the data content of the register to the shift register may be simplified and accelerated.

According to another exemplary embodiment of the present invention, each shift register cell is a charge-coupled device (CCD) element. For example, each shift register cell may have a cell transfer gate, a charge storage unit, and an inverter. A shift register cell fashioned in this way does not constitute a complete flip-flop, and thus requires a correspondingly smaller amount of silicon surface. Nonetheless, the memory cells of the shift register according to an exemplary embodiment of the present invention may receive the content of a register bit rapidly and reliably, may store it intermediately at least for the duration of the loading of the register by a higher-priority application, and, after termination of the higher-priority application, may transfer it rapidly and reliably back into the register bit.

The inverter may include two transistors connected in series. The cell transfer gate includes at least one transistor. The charge storage unit of an exemplary shift register cell according to the present invention may be a gate capacitor of the inverter. Alternatively, the charge storage unit may be a separate capacitor. According to this exemplary embodiment, the shift register cell thus has only three transistors. In contrast, for example, it is believed that an SRAM storage cell has six or four transistors. It is also believed that a DRAM cell has only one transistor, but requires an extensive refresh logic unit.

According to another exemplary embodiment of the present invention, an input transfer gate is situated between the register and the first shift register cell. According to yet another exemplary embodiment of the present invention, the last shift register cell is connected with the first shift register cell via an output transfer gate. By opening the output transfer gate, the content of the last shift register cell may be shifted into the first shift register cell, as long as its transfer gate is open. If the transfer gate of the first shift register cell is closed and the input transfer gate is open, the content of the last shift register cell may also be shifted directly into the register bit to which the shift register is allocated.

The cell transfer gates are connected with a clock generator to shift the data contents of the shift register cells from one shift register cell to the next in the pulse of the clock generator. Likewise, the input transfer gate and the output transfer gate are connected with a clock generator. By controlling, i.e., opening or closing the various transfer gates of the shift register in the pulse of the clock generator, the data contents of the register may be received, shifted back and forth within the shift register, and transferred to the register again. The clock generator may be clocked by the system clock of the microcomputer or a multiple thereof.

DETAILED DESCRIPTION

Figure 1:
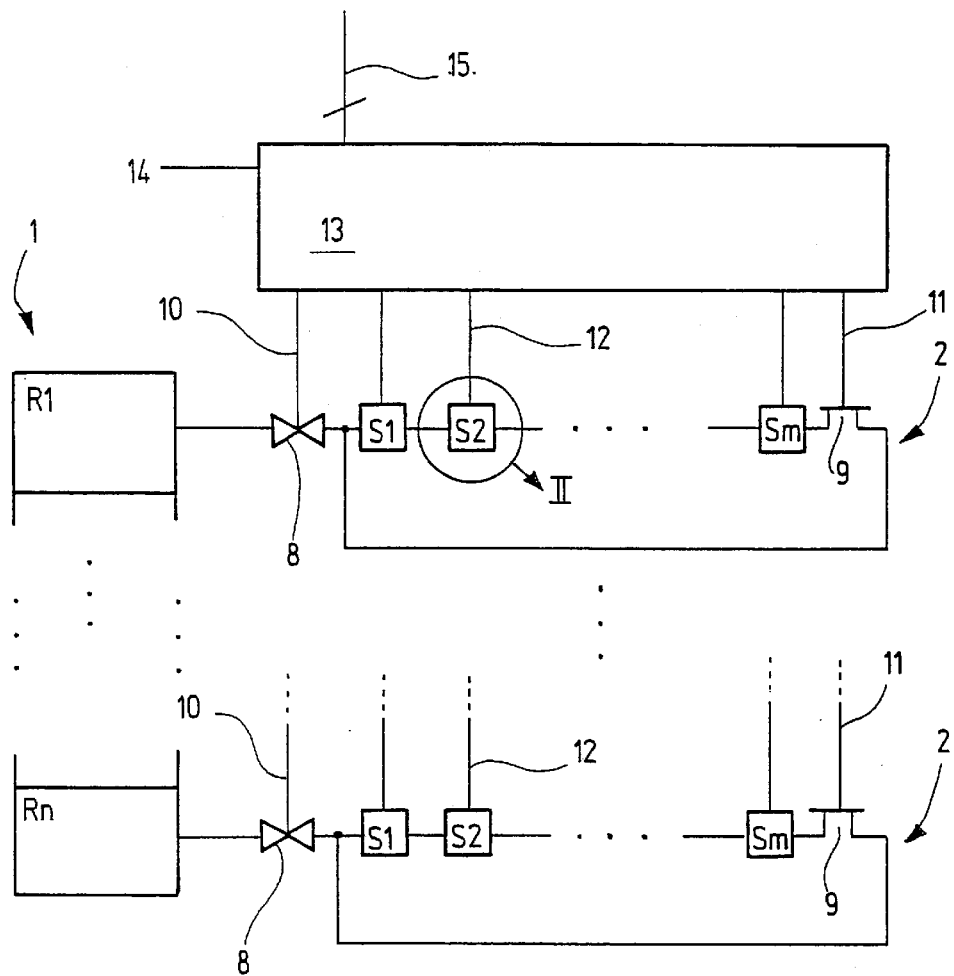
FIG. 1 shows an exemplary register system according to the present invention.

FIG. 1 shows an exemplary register system according to the present invention. This exemplary embodiment has a register 1 including a plurality of register bits R1 to Rn. A shift register 2, having a plurality of shift register cells S1, S2 to Sm, is allocated to each register bit R1 to Rn.

Figure 2:
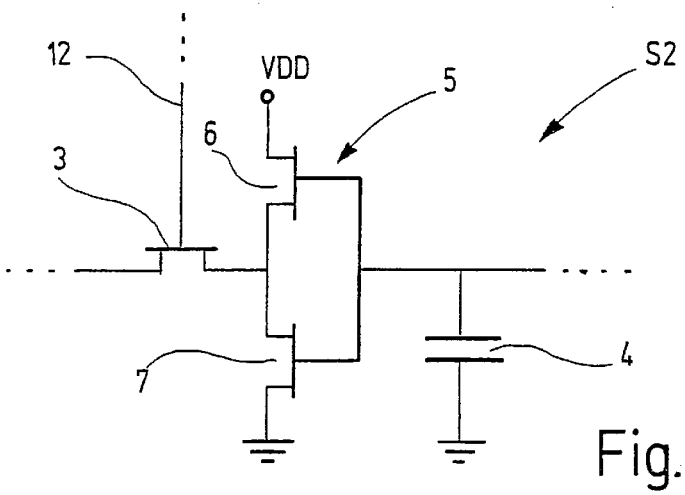
FIG. 2 shows further detail of a shift register cell of a shift register shown in FIG. 1.

The design of a shift register cell S1 to Sm is explained in more detail below with reference to FIG. 2, in which shift register cell S2 of shift register 2, allocated to first register bit R1, is shown in an enlarged view. The remaining shift register cells are constructed correspondingly. Shift register cell S2 is a charge-coupled device (CCD) element. Shift register cell S2 has a cell transfer gate 3, a charge storage unit 4, and an inverter 5. Cell transfer gate 3 is a transistor. Inverter 5 has two transistors 6, 7, connected in series. Transistor 6 is a pmos transistor, and transistor 7 is an nmos transistor. The source of transistor 6 is connected to supply voltage VDD, and the drain of transistor 7 is connected to ground. Charge storage unit 4 is a gate capacitor of inverter 5. Alternatively, it may be a separate capacitor.

An input transfer gate 8 is situated between register 1 and each of first shift register cells S1 of shift register 2. Last shift register cells Sm of shift register 2 are each connected, via an output transfer gate 9, with first shift register cell S1 of the respective shift register 2. Input transfer gate 8 is connected with a clock generator 13 via an input timing circuit 10. Output transfer gate 9 is connected with this clock generator 13 via an output timing circuit 11, and cell transfer gate 3 of shift register cells S1 to Sm is connected with this clock generator 13 via a timing circuit 12. Clock generator 13 receives the timing pulse from a system clock 14 of the microcomputer. Through a corresponding controlling of transfer gates 3, 8, 9 via timing circuits 10, 11, 12, the data contents of register 1 may be saved in shift register 2, the data filed there may be shifted back and forth, and the data contents may then be transferred again from shift register 2 into register 1. The content of register bits R1 to Rn may thus be stored in an arbitrary shift register cell S1 to Sm of the shift register 2 allocated to the respective register bit R1 to Rn, and, conversely, may also be transferred from an arbitrary shift register cell S1 to Sm back into register bit R1 to Rn.

In a shift register 2, the shifting of the content from one shift register cell S1 to Sm to the next may lasts, e.g., 5 ns. If the data content of shift register cells S1 to Sm may be shifted only in one direction, then, in a shift register 2 having, for example, ten shift register cells S1 to Sm, a maximum access time of 50 ns results to the data content of a shift register cell S1 to Sm. A register file select circuit 15 determines which of the shift registers 2 is to be controlled by clock generator 13 at a particular timing pulse.

In each instance, first shift register cells S1 of shift register 2 form a first register bank. Likewise, second shift register cells S2 of shift register 2 form a second register bank, up to the last shift register cells Sm, which form an m-th register bank. However, the register banks constructed from shift register cells S1 to Sm require a small silicon surface because the individual shift register cells S1 to Sm are not fashioned as complete flip-flops, and have only three transistors 3, 6, 7. In this way, the space requirement of an exemplary register system according to the present invention may be reduced, and the manufacturing costs may be kept low due to the required small silicon surface.

What is claimed is:

1. A register system of a microcomputer, comprising:

a register including at least one register bit; and an additional storage arrangement allocated to the register and operable to intermediately store a data content of the register, wherein the additional storage arrangement includes at least one shift register having at least two shift register cells, a content of a selected one of the shift register cells is movable into one of the register bits, and a content of a selected one of the register bits is movable into one of the shift register cells.

2. The register system of claim 1, wherein a shift register is allocated to each of the register bits of the register.

3. The register system of claim 1, wherein each of the shift register cells includes a charge-coupled device element.

4. The register system of claim 3, wherein each of the shift register cells includes a cell transfer gate, a charge storage unit, and an inverter.

5. The register system of claim 4, wherein the cell transfer gate of each of the shift register cells includes at least one transistor.

6. The register system of claim 4, wherein the charge storage unit of each of the shift register cells includes one of a gate capacitor of the respective inverter and a separate capacitor.

7. The register system of claim 1, wherein an input transfer gate is situated between the register and a first one of the shift register cells.

8. The register system of claim 7, wherein a last one of the shift register cells is connected to the first one of the shift register cells via an output transfer gate.

9. The register system of claim 8, wherein the input transfer gate and the output transfer gate are connected to a clock generator.

* * * * *